(12) United States Patent
Chaichanavong

(10) Patent No.: US 8,049,648 B2
(45) Date of Patent: Nov. 1, 2011

(54) SYSTEMS AND METHODS FOR CONSTRUCTING HIGH-RATE CONSTRAINED CODES

(75) Inventor: Panu Chaichanavong, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/772,891

(22) Filed: May 3, 2010

(65) Prior Publication Data

US 2010/0231425 A1 Sep. 16, 2010

Related U.S. Application Data

(63) Continuation of application No. 11/326,727, filed on Jan. 5, 2006, now Pat. No. 7,714,748.

(60) Provisional application No. 60/702,042, filed on Jul. 22, 2005, provisional application No. 60/706,624, filed on Aug. 9, 2005, provisional application No. 60/752,554, filed on Dec. 21, 2005.

(51) Int. Cl.
*H03M 5/00* (2006.01)

(52) U.S. Cl. ............... 341/58; 341/59; 341/65; 341/67; 341/90; 341/94

(58) Field of Classification Search ............. 341/58, 341/59, 65, 67, 90, 94
See application file for complete search history.

(56) References Cited

U.S. PATENT DOCUMENTS

| | | | |
|---|---|---|---|
| 4,787,093 A * | 11/1988 | Rorden | 375/239 |
| 5,297,170 A * | 3/1994 | Eyuboglu et al. | 375/242 |
| 5,373,513 A | 12/1994 | Howe et al. | |
| 5,440,404 A * | 8/1995 | Okamoto | 382/246 |
| 5,537,382 A * | 7/1996 | McLaughlin et al. | 369/59.24 |
| 5,850,482 A * | 12/1998 | Meany et al. | 382/232 |
| 6,018,304 A | 1/2000 | Bessios | |
| 6,026,198 A * | 2/2000 | Okada | 382/247 |
| 6,400,289 B1 * | 6/2002 | Banerji | 341/60 |
| 6,417,788 B1 | 7/2002 | McEwen et al. | |
| 6,557,124 B1 | 4/2003 | Cideciyan et al. | |
| 6,617,985 B1 * | 9/2003 | Poeppelman | 341/94 |
| 6,898,248 B1 * | 5/2005 | Elgamal et al. | 375/259 |
| 6,959,412 B2 | 10/2005 | Silvus et al. | |
| 7,030,789 B1 * | 4/2006 | Cideciyan et al. | 341/83 |
| 7,102,555 B2 | 9/2006 | Collins et al. | |
| 7,443,319 B2 * | 10/2008 | Schwartz et al. | 341/58 |
| 7,714,749 B2 * | 5/2010 | Feller | 341/58 |
| 7,786,902 B1 * | 8/2010 | Oberg | 341/50 |
| 2006/0022847 A1 * | 2/2006 | Lee et al. | 341/50 |
| 2006/0233239 A1 | 10/2006 | Sethi et al. | |
| 2007/0164881 A1 * | 7/2007 | Schwartz et al. | 341/50 |

OTHER PUBLICATIONS

Immink, Kees A. Schouhamer, "A Practical Method for Approaching the Channel Capacity of Constrained Codes," IEEE Transactions on Information Theory, vol. 43, No. 5, Sep. 1997.

Feng, Weishi and Sutardja, Pantas, "Data Storage without RLL Coding," Marvell Semiconductor, Inc. Confidential Memo, Nov. 8, 2002.

(Continued)

*Primary Examiner* — Linh Nguyen

(57) ABSTRACT

A high-rate constrained code is provided to encode/decode channel data. A transformer translates binary channel data into an arbitrary alphabet size. The transformer selects an indicator word and makes forbidden prefix substitutions in the data to be transformed. A finite-state encoder imposes some user-defined constraint on the transformed data before the data is transferred to the channel. The high-rate constrained coding technique may be used to produce high-rate DC-limited and run-length-limited codes. The high-rate code can be used in tandem with error-correcting codes.

20 Claims, 15 Drawing Sheets

OTHER PUBLICATIONS

Fan, John L., "A Modified Concatenated Coding Scheme with Application to Magnetic Data Storage," IEEE Transactions on Information Theory, vol. 44, No. 4, Jul. 1998.

Bliss, W.G., "Circuitry for Performing Error Correction Calculations on Baseband Encoded Data to Eliminate Error Propagation," IBM Technical Disclosure Bulletin, vol. 23, No. 10, Mar. 1981.

* cited by examiner

US 8,049,648 B2

SYSTEMS AND METHODS FOR CONSTRUCTING HIGH-RATE CONSTRAINED CODES

CROSS REFERENCE TO RELATED APPLICATION

This application is a continuation of U.S. patent application Ser. No. 11/326,727, filed Jan. 5, 2006, which claims the benefit of U.S. Provisional Patent Application Ser. Nos. 60/702,042, filed Jul. 22, 2005; 60/706,624, filed Aug. 9, 2005; and 60/752,554, filed Dec. 21, 2005The aforementioned earlier filed applications are hereby incorporated by reference herein in their entireties.

BACKGROUND OF THE INVENTION

This invention relates generally to the transmission of information over a channel and, more particularly, to encoding schemes for transmitting information using high-rate constrained codes.

In the field of digital communications, information must typically be encoded before it can be transmitted over a communications channel or recorded on a medium. First, if the information is not already in digital form, it is typically digitized through the use of an analog-to-digital converter so that the information is represented as symbols from the set of binary digits or bits, (0,1). Next, the digitized information may optionally be compressed to represent the information in a reduced number of symbols. Any reduction in the number of symbols due to compression may be partially offset through the use of error-correcting codes. Error-correcting codes introduce additional symbols, called redundancy, to a data signal to form an encoded signal. In particular, an error-correcting code operates on groups of symbols, called information words, in the data signal. Each information word is used to generate, according to a prescribed error-correcting coding rule, a codeword comprising a larger group of symbols.

Importantly, an additional or further kind of coding, termed modulation coding, is often used to process information (such as the encoded signal generated using the error-correcting codes) before transmission over a channel or recording on a medium. In particular, modulation coding advantageously transforms a group of input symbols (such as a group of symbols including a codeword generated by an error-correcting code) and generates a channel or modulation codeword comprising a larger number of symbols than the number of symbols in the group of input symbols. As with error-correcting codes, modulation coding can improve a system's immunity to noise. Perhaps more importantly, modulation codes can advantageously be used to regulate time parameters (e.g. for controlling oscillator or counting circuits) and to regulate gain parameters (e.g. for amplifier circuits) in recording and communications systems.

For example, a system may wish to record or read a channel codeword comprising a sequence of binary digits on a magnetic medium (e.g., a hard disk, magnetic tape, etc.). The binary sequence is advantageously used to modulate or control the flow of an electrical current in one of two opposite directions. The current, in turn, produces a magnetic field in one of two opposite directions depending on the direction of the current. In particular, transitions from one direction in the current (and hence in the magnetic field) to the other correspond to a binary "1" in the codeword sequence. A binary "0" in the sequence causes no change in the direction of magnetization. Thus, the first "1" in the sequence of the codeword would cause the current (and corresponding magnetic field) to transition or switch to the opposite direction. The current and corresponding magnetic field would remain in the opposite direction until the next "1" is encountered in the codeword sequence.

To represent the binary codeword sequence on the magnetic medium, the magnetic medium is divided into portions with each portion corresponding to a particular digit in the binary sequence. Each portion of the magnetic medium is then exposed to a magnetic field according to its corresponding bit in the channel codeword, and the output is consequently magnetized by the field in one of the two directions. The information recorded on the medium is termed a channel sequence and is defined by the channel codeword. The channel sequence comprises channel symbols, but, unlike the symbols in the information and channel codewords described above, the channel symbols in a channel sequence for a magnetic medium are advantageously selected from a set of bipolar symbols, $(-1,1)$, which set of symbols more closely reflects the physical manifestation of the channel sequence on the medium in which the portions are magnetized with equal (i.e. unit) intensity in one of two bi-polar directions.

The channel codeword which defines the channel sequence is read by detecting a change in a voltage signal caused by either changes in the magnetization of portions of the medium or by noise in the system. The voltage signal is a pulse each time a "1" is detected and noise each time a "0" is detected. The position of the pulses carries information about timing parameters in the system, and the height of the pulses carries information about gain parameters in the system. Importantly, however, if a long string of "0's" are read, there is no voltage output (other than noise), and hence no timing or gain information, thereby leading to a loss of, or drift in, timing and gain parameters. Thus, modulation coding schemes which advantageously avoid the recording or transmission of long strings of binary zeros in channel codewords (e.g., run-length-limited or "RLL" codes) may be used to ensure accurate timing and gain information.

In addition to ensuring accurate timing and gain information, modulation coding may also advantageously be used to generate "DC-limited" coding sequences. It is preferable that a stream of data to be encoded be balanced in such a way so as to include an equal number of logical one bits and logical zero bits. In electrical signal terms, a balanced data stream (i.e., a "DC-free" sequence) does not have a corresponding DC component, whereas an unbalanced data stream has a DC component. Balanced data is desirable for many reasons, especially because balanced data permits the use of AC-coupled circuits in the communication or recording link and simpler regulation and detection in optical and magnetic receivers. Balanced data can also provide further immunity from noise.

DC-limited and DC-free codes are increasingly used in such areas as high-density and perpendicular recording to improve performance. The main difference between traditional longitudinal recording and perpendicular recording is the orientation of the media grains. In the case of longitudinal recording, the magnetization is lying in the plane of the magnetic medium. When the media is magnetized by the recording head, the average magnetization is pointing in the down-track direction. When perpendicular head and media are used, the media grains are oriented in the depth of the medium, and their magnetization is pointing either up or down. With this arrangement, DC-limited data is highly desirable to reduce DC baseline wandering and data distortion.

More particularly, DC-free codes have a spectral null at zero frequency. This can be approximated by bounding the running digital sum (i.e. the arithmetic sum) of all the symbols transmitted in the sequence over a channel or recorded on a medium. One way to assure a DC-free or DC-limited sequence is to design a system in which the block digital sum or the arithmetic sum of symbols in a channel sequence approaches zero. However, these codes are difficult to produce without adding an excessive number of symbols to the information to be recorded, resulting in very low code rates. In addition, these codes typically require complex encoding and decoding circuitry that often require large power consumption and a large amount of area on integrated circuits relative to other elements in the transmission or recording system.

Thus, it would be desirable to provide an efficient, high-rate constrained coding scheme for encoding data to be transmitted or recorded. This constrained coding scheme could be used to generate high-rate DC-limited codes. The coding scheme may be simple enough to implement in software and may be used in tandem with other codes, such as error-correcting codes.

SUMMARY OF THE INVENTION

These and other objects of the invention are accomplished in accordance with principles of the present invention by providing a method and system for constructing constrained codes. The methods and systems may be used to construct a wide variety of high-rate constrained codes, including high-rate DC-limited codes.

A transformer is used to convert digital channel data into data with an arbitrary alphabet size. The transformed data is then passed through a finite-state encoder, which outputs a constrained binary sequence. The finite-state encoder may introduce any desirable constraint into the transformed data, including, for example, DC constraints and various runlength constraints.

In at least some embodiments, the constrained codes are combined with error-correcting codes, such as, for example, Reed-Solomon ("RS") codes. The computed parity information may be encoded and appended to the constrained data or split into separate symbols and inserted or interleaved into the constrained data. In one embodiment of the invention, transformer means may translate a binary sequence into a transformed sequence of a different alphabet size. Constraining means may be used to impose at least one constraint on the transformed sequence, and output means may output the transformed sequence.

In one embodiment of the invention, a computer program running on a processor is provided for encoding and/or decoding a data sequence. The program may include program logic to translate the data sequence into a transformed sequence of a different alphabet size. The program logic may impose at least one constraint on the transformed sequence and output the transformed sequence.

The invention also includes methods and, systems for encoding and decoding signals of the types summarized above.

Further features of the invention, its nature and various advantages, will become more apparent from the accompanying drawings and the following detailed description.

DETAILED DESCRIPTION OF THE PREFERRED EMBODIMENTS

Embodiments of the present invention relate to high-rate constrained codes for use in encoding and decoding digital data for transmission through, or storage on, various communication channels. The present invention can be used in any communication channel in which constrained codes, and in particular, DC-limited codes, are useful, such as in data storage and media systems.

Figure 1:
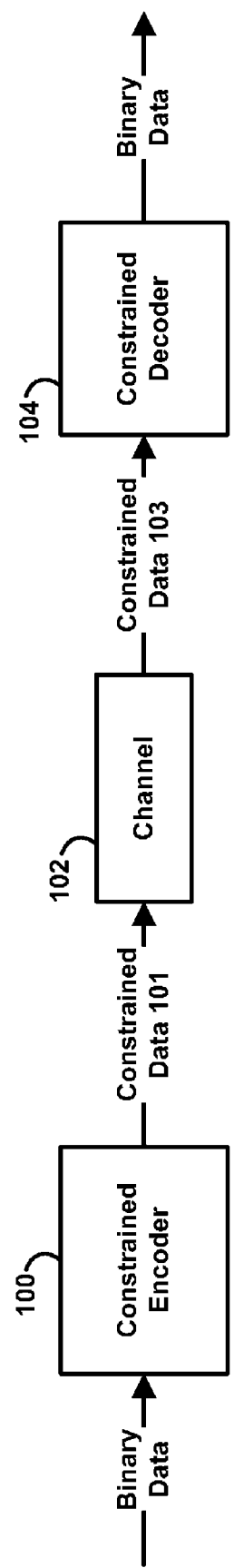
FIG. 1 is a simplified block diagram of an illustrative, typical constrained encoding and decoding sequence in accordance with one embodiment of the invention.

FIG. 1 depicts a simplified block diagram of an illustrative, typical constrained encoding and decoding sequence in accordance with one embodiment of the invention. Conventionally, the first step in encoding information using a constrained code is to convert the information into binary data. This is typically accomplished through the use of an analog-to-digital converter. Once the information is digitized, it is passed through constrained encoder 100. Constrained encoder 100 may be any device that electronically manipulates, alters, or transforms arbitrary input data to sequences that satisfy one or more constraints. An example of constrained encoder 100 may be a finite-state encoder or block-decodable encoder. Constrained encoder 100 may include an error-correcting encoder and may work in tandem with an error-correcting code. Constrained encoder 100 outputs constrained data 101.

Constrained data 101 is then passed through channel 102. Channel 102 may include any path over which electrical signals may pass. Typically, these paths contain at least some noise and introduce error into constrained data 101. For example, channel 102 may include a wireless transmission channel or a recording channel, such as a hard disk. Because of the noise inherent in channel 102, constrained data 103 that is recorded on, or passed through, channel 102 is usually not identical to constrained data 101 that enters channel 102.

Constrained decoder 104, which may include error-detection and/or error-correction functionality, decodes constrained data 103 and outputs binary output data. Constrained decoder 104 may use redundancy information to detect and/or correct errors in the constrained data introduced by channel 102. Constrained encoder 100 and constrained decoder 104 may be implemented in hardware, software, or a combination of both hardware and/or software. In addition, constrained encoder 100 and constrained decoder 104 may be largely programmable.

Figure 2:
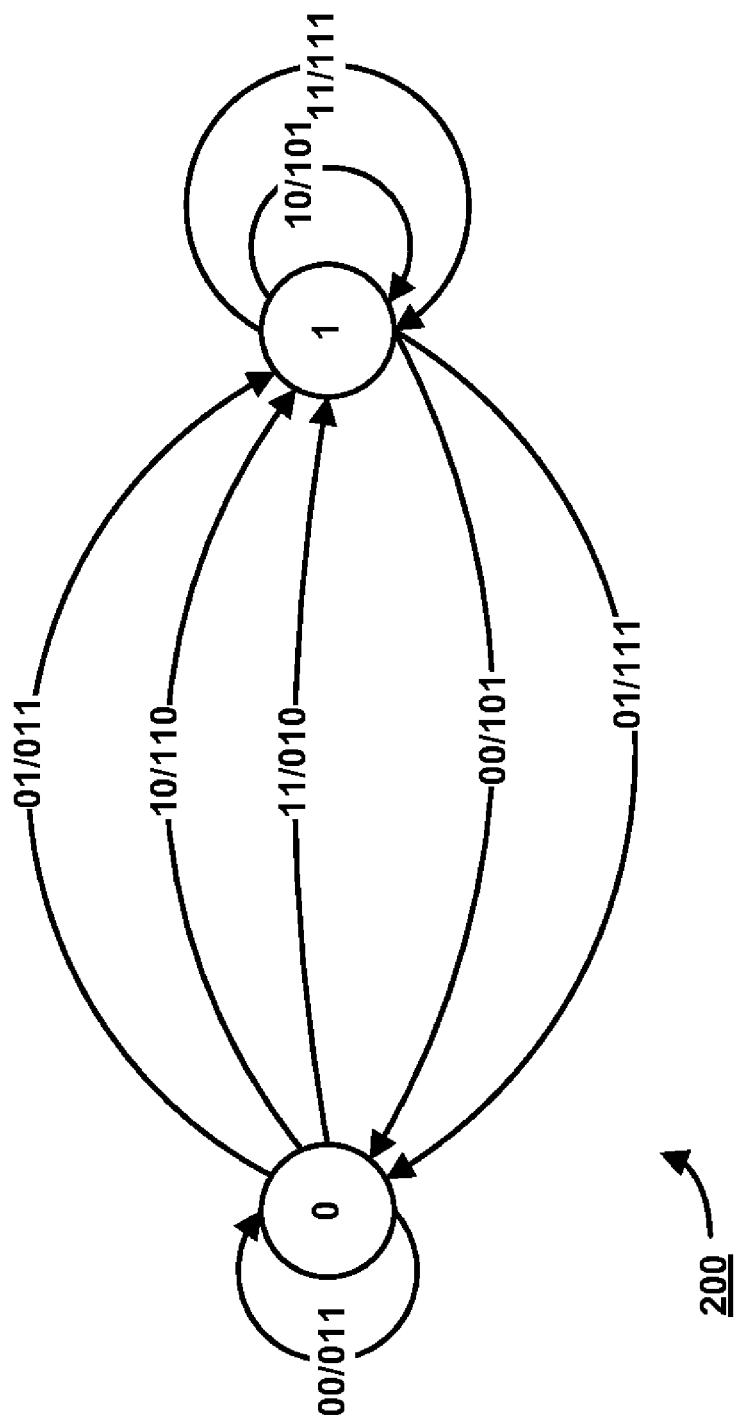
FIG. 2 is an illustrative presentation of a finite-state encoder in accordance with one embodiment of the invention.

FIG. 2 is an illustrative presentation of a finite-state encoder in accordance with one embodiment of the invention. A constraint is usually presented by a labeled directed graph, called a presentation, so that a sequence satisfies the constraint if and only if the sequence is the label of a path in its directed graph. A constrained sequence is obtained by reading the labels of some path in the directed graph. It is understood that every constraint has a deterministic presentation, in which at each state all outgoing edges have distinct labels.

Directed graph 200 of FIG. 2 has two states, 0 and 1. Connecting these two states are a number of edges with two types of labels: input labels and output labels (depicted in FIG. 2 as input/output). The output label of an edge in the encoder presentation is called a codeword. The rate of a constrained encoder is given by the ratio of the number of the encoder's input bits p and the number of the encoder's output bits q. In the example of FIG. 2, a ⅔-rate encoder is shown because this encoder takes 2 bits as input and produces 3 bits based on the input and the encoder's current state. The presentation of this encoder has $2^2$ outgoing edges from each state, labeled 0 and 1 in the example of FIG. 2, and these edges are each labeled by a 3-bit codeword.

To construct high-rate constrained codes, typically the values of p and q must be very large. This results in a very complex presentation with $2^p$ outgoing edges from each state and a q-bit codeword label. As the values of p and q are increased, the complexity of these finite-state encoders quickly becomes impractical. However, if the binary input data is able to be transformed to data with an arbitrary alphabet size m instead of the standard p-bit alphabet with size $2^p$, the finite-state encoder may achieve higher code rates by accepting and encoding data input with an arbitrary alphabet size. Thus, the rate of this new finite-state encoder is $\log_2(m)/q$ where m is the alphabet size of the input data and g is the number of bits in the output codeword.

By varying the input data alphabet size and block length q, an arbitrary rate constrained code can be constructed. By optimizing the alphabet size and block length, an extremely high-rate constrained code can be produced with a much smaller block length q. For example, if the binary input data is transformed to have an alphabet size of 31, a $\log_2(31)/5$ or approximately 0.99-rate code can be achieved using a block length of only 5. This code is much simpler to implement and transform into a finite-state encoder than a 99/100-rate code.

However, having an alphabet size, for example, of 31, which is not a power of 2, poses a problem. Since the input data is almost always binary, converting the input data to an alphabet size m that is not equal to $2^p$ is extremely difficult to implement in hardware or software. Especially when the block size is large, a great deal of computation is needed to perform the alphabet size change operation. To simplify the process, a novel transformer is used in the data encoding and decoding process to transform data between different alphabet sizes.

Figure 3:
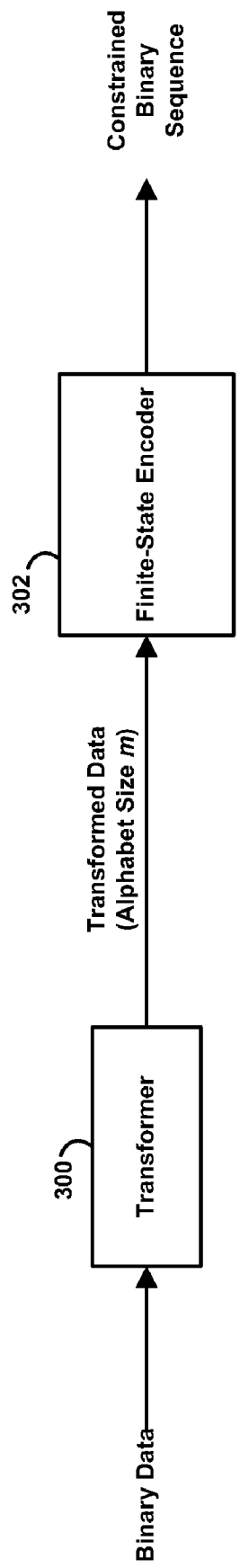
FIG. 3 is a simplified block diagram of an illustrative encoding sequence in accordance with one embodiment of the invention.

FIG. 3 depicts a simplified block diagram of an illustrative encoding sequence using a transformer in accordance with one embodiment of the invention. Binary data to be encoded is first passed through transformer block 300. The transformer is configured to change the alphabet size of its input binary data into any arbitrary alphabet size m. Transformer block 300 is shown in more detail in FIG. 4 in accordance with an illustrative embodiment of the invention. The transformed data (now with alphabet size m) is then encoded by finite-state encoder block 302. Finite-state-encoder block 302 enforces some constraint, such as a run-length constraint, an interleaved constraint, a DC constraint, or any other desired constraint, on the transformed data.

Figure 4A:
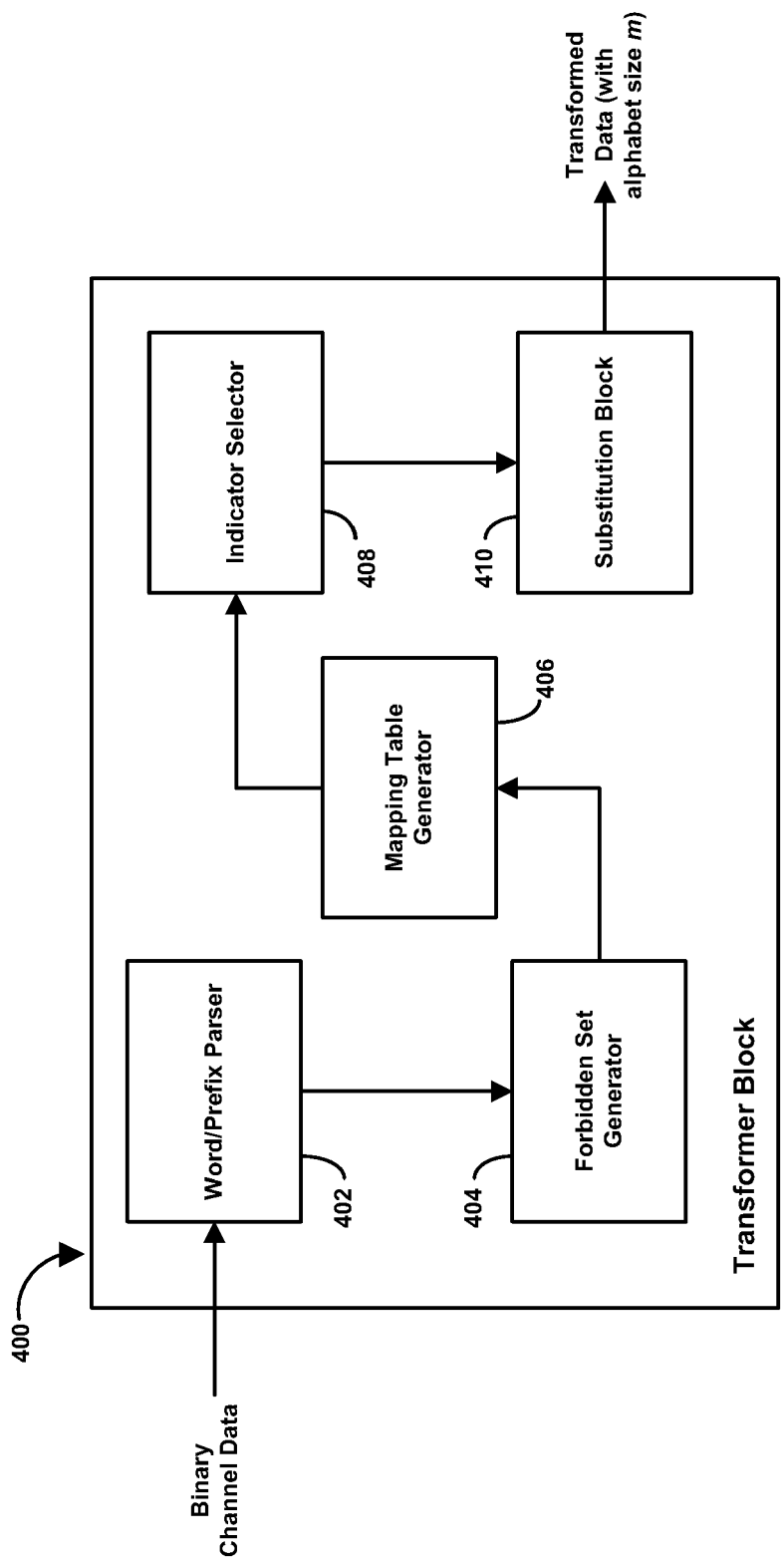
FIG. 4A is an illustrative simplified transformer block used to transform channel data into data with an arbitrary alphabet size in accordance with one embodiment of the invention.

FIG. 4A show simplified, illustrative transformer block 400 in accordance with one embodiment of the invention. The binary channel data to be encoded is inputted into word/prefix parser 402. For example, data may enter transformer block 400 from any data controller, transceiver, or any other data transfer mechanism. Binary channel data may enter transformer block 400 in blocks of words or a stream of data, which may then be parsed into words of data. Advantageously, word/prefix parser 402 may parse the binary input data into words of a fixed bit length. For example, transformer block 400 may operate on n words of q bits each. In the depicted example, transformer block 400 is configured to transform its binary input data of length q×n bits to data with alphabet size m; however, it is to be clearly understood that transformer block 400 may be configured to transform input binary data into any desired alphabet size.

Word/prefix parser 402 then separates each word into a prefix portion and a suffix portion. For each word in the binary input data, the prefix portion is the first q−r bits of each word. The suffix portion is the remaining r bits of each word. The number of bits to use as the prefix and suffix portions varies depending on the desired alphabet size, but in one embodiment the value r is given by $2^{r-1}<2^q-m \leq 2^r$, where m is the desired transformed alphabet size.

Once the appropriate prefixes are found, forbidden set generator 404 creates a set of forbidden words F. In general, if the binary data is to be transformed into an alphabet size m, this set of forbidden words is of size $2^q-m$. For example, if an alphabet size of 31 is desired using a block length of 5 bits, the forbidden set may include 1 forbidden word. Forbidden set generator 404 may choose any word for inclusion into the set of forbidden words. Typically, however, words that are simple for the finite-state encoder to process are selected by forbidden set generator 404 for use as forbidden words. For example, the all-ones word "1111 . . . 1" or the all-zeros word "0000 . . . 0" may be included in the set of forbidden words.

Once forbidden set generator 404 has selected the appropriate number of forbidden words, control passes to mapping table generator 405. Mapping table generator 405 may create a table T that maps each word in forbidden set F to a unique suffix. Typically, each binary sequence included in the table generated by mapping table generator 405 is r bits long.

Next, indicator selector 408 of transformer block 400 selects a prefix v called the indicator of the sequence. In one embodiment, indicator selector 408 chooses a prefix that is not the prefix of any word in F and not the prefix of any word in the binary input data. Indicator selector 408 is guaranteed to find such an indicator v if the number of input words n is strictly less than $2^{q-r}-s$, where s is the number of distinct prefixes of words in F. This constraint may be relaxed if some information is known about the binary data input (e.g., the data takes only certain values).

Once indicator selector 408 finds a valid indicator, the data is transformed by substitution block 410. In one embodiment, substitution block 410 scans the n input data words for words included in the forbidden set of words F. For each word in the forbidden set, substitution block 410 may create a new substitute word equal to the mapped value corresponding to the forbidden word in the mapping table T appended to the indicator v. The forbidden word may then be replaced by this substitute word. Since the indicator v is not the prefix of any forbidden word, the substitute word is not forbidden. Substitution block 410 may repeat this process for every occurrence of a forbidden word. Finally, before the data is output from transformer block 400, the indicator v is appended to the transformed data. In some embodiments, the indicator v is appended to the beginning of the transformed data, while in other embodiments, the indicator v is appended to the end of the transformed data or interleaved within the transformed data. The appended indicator will be used in the decoding process.

To increase the number of input words n allowed into transformer block 400 (and hence improve the code rate), transformer block 400 may carefully select the unique binary sequences in forbidden set mapping table T. If the number of forbidden patterns is strictly less than $2^r$ where r is the suffix length, the mapping table T may be chosen so that the number of prefixes that can precede the suffixes in T without being forbidden is maximized. This modification increases the number of candidates for the indicator v. The maximum input length is accordingly increased as well.

Transformer block 400 may also improve the code rate in other ways. For example, transformer block 400 may choose the indicator v so that the indicator v is the prefix of no more than a fixed number of words in the input data. In some embodiments, the indicator is the prefix of no more than one word in the input data. This word may be denoted w. To avoid confusion at the decoder, transformer block 400 must append some redundancy, in addition to the indicator v, to the transformed data. Transformer block. 400 also picks the mapping table T so that the first b bits of every suffix in T are different from the first b bits of the suffix of w. In this embodiment, table T may vary according to the input data into transformer block 400. After substitution block 410 replaces the forbidden patterns, the redundancy is appended to the transformed data. In one embodiment, the redundancy is the first b bits of w. This way, when the decoder processes the encoded data, the decoder may scan for a block with prefix v. If the first b bits of the block's suffix match the appended redundancy, the block is the original block. Else, the block was replaced by substitution block 410. The decoder then uses table T to convert the block back to the original input data. In this way, the maximum input into transformer block 400 is dramatically increased, while only a small redundancy was added to the transformer output.

Figure 4B:
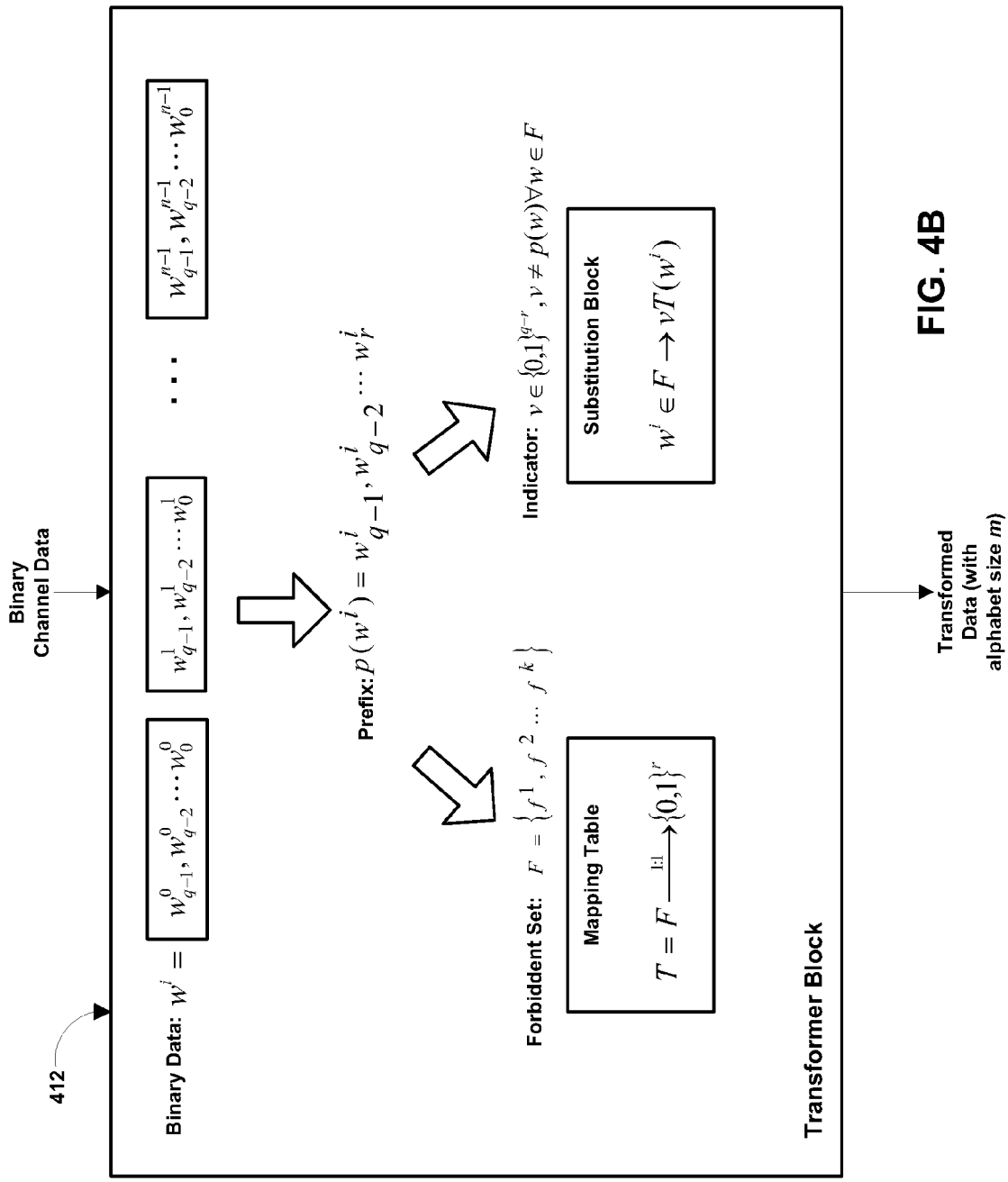
FIG. 4B is a more detailed, yet still simplified, illustrative transformer block of FIG. 4A in accordance with one embodiment of the invention.

FIG. 4B shows illustrative transformer block 400 in more detail, but still simplified. Transformer block 412 receives binary channel data and transforms the binary data into data with alphabet size m. The data may be transformed into an alphabet size of any desirable value. Advantageously, the alphabet size m is not a power of 2. Transformer block 412 may perform several operations on the input data during the transformation process. To carry out these operations, transformer block may be connected to storage or dedicated memory (not shown), including RAM, ROM, and hybrid types of memory. This memory may store certain tables and functions that are useful in the encoding or transformation process. Transformer block 412 may be completely implemented in software, using standard programming approaches, or transformer block 412 may be partially or wholly implemented in hardware.

Referring to FIG. 4A, word/prefix parser 402, forbidden set generator 404, mapping table generator 406, indicator selector 408, and substitution block 410 may all be separate elements in transformer block 400 or their functionality may be combined into one or more combination elements. Although a typical conversion sequence from a binary data input to a alphabet size m data output is described in the illustrated embodiments above, the order of the transformer operations is, in most cases, arbitrary. In addition, the majority of the operations, including, for example, the indicator selection, the forbidden set generation, the mapping table generation, and the data substitution, may be programmable by the user. For example, if transformer block 400 is implemented in software, initialization data values may be passed into the software routine to affect the transformer's operations. Explicit indicator values, prefix lengths, forbidden prefixes, and desired alphabet sizes may also be passed into transformer block 400 to further dynamically customize the transformation.

Once the binary input data is transformed into data of alphabet size m, the data is encoded using a constrained encoder, such as a finite-state encoder. The finite-state encoder takes an unconstrained sequence of transformed data and translates the data to meet one or more user-defined constraints. Although in FIG. 3 the encoder is a finite-state encoder, encoder 302 may comprise, for example, a modulation encoder, a look-ahead encoder, a block-decodable encoder, or any other data encoder, translator, or modulator.

Figure 5:
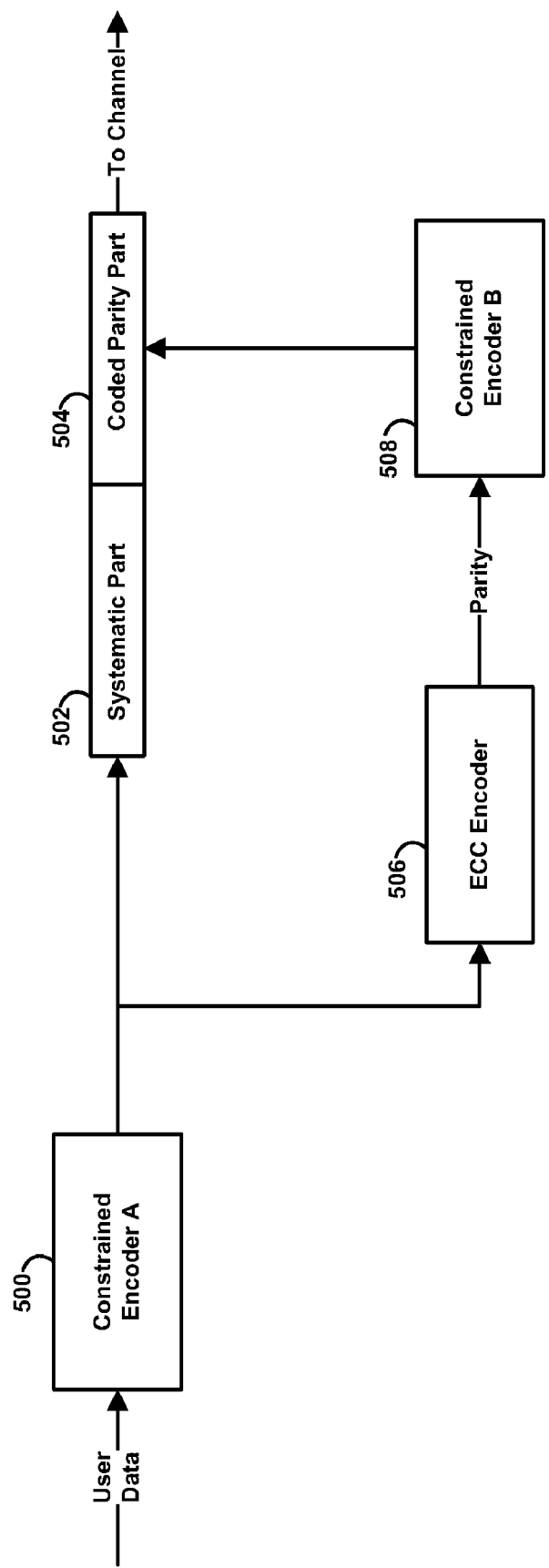
FIG. 5 is a simplified block diagram of an illustrative sequence for combining a constrained code with an error-correcting code in accordance with one embodiment of the invention.

The data encoder may also work in tandem with an error-correcting code ("ECC") as shown in the illustrative block diagram of FIG. 5 in accordance with one embodiment of the invention. This error-correction scheme is referred to as reverse concatenation. The output of constrained encoder A 500 (which may be of alphabet size m) is passed to ECC encoder 506. ECC encoder 506 may comprise any convolution or block encoder, such as a Reed-Solomon encoder. The output of constrained encoder A 500 is also used as systematic part 502 of the channel codeword. ECC encoder 506 computes the parity of the output of constrained encoder A 500. Constrained encoder B 508 encodes this parity information and appends it to the channel codeword as coded parity part 504. Since the constrained code of constrained encoder B 508 will be decoded before ECC decoding, the code of constrained encoder B 508 should not propagate errors.

Figure 6:
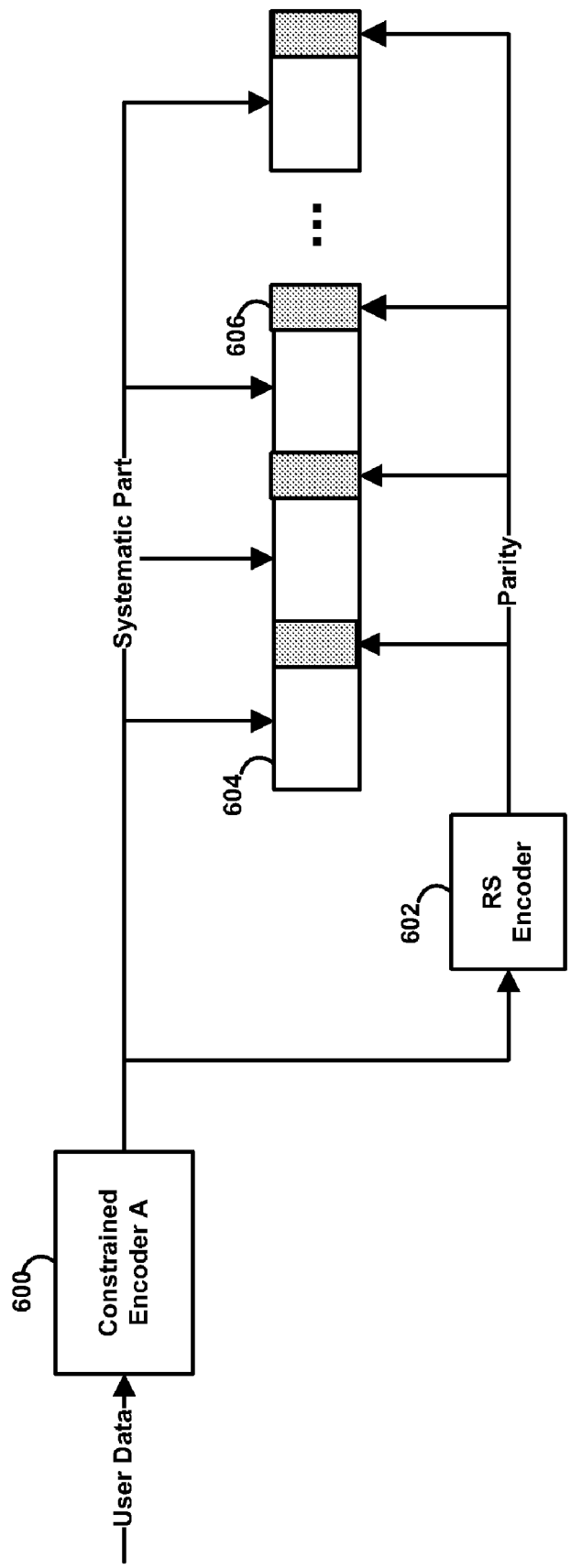
FIG. 6 is a simplified block diagram of an illustrative sequence for combining a constrained code with an Reed-Solomon code in accordance with one embodiment of the invention.

Another way of combining a constrained code with an error-correcting code is to interleave the parity within the constrained code. FIG. 6 is a simplified block diagram of an illustrative sequence for using this process on a Reed-Solomon code in accordance with one embodiment of the invention. Constrained encoder A 600 outputs the constrained code in systematic parts 604. Reed-Solomon encoder 602 splits the calculated parity information into blocks and inserts the blocks into systematic parts 604 of the constrained code. Because the parity information is not encoded, the constraints on the output code are weaker than the constraints imposed by constrained encoder A 600. However, as opposed to the sequence of FIG. 5, this scheme does not require extra redundancy bits.

Figure 7:
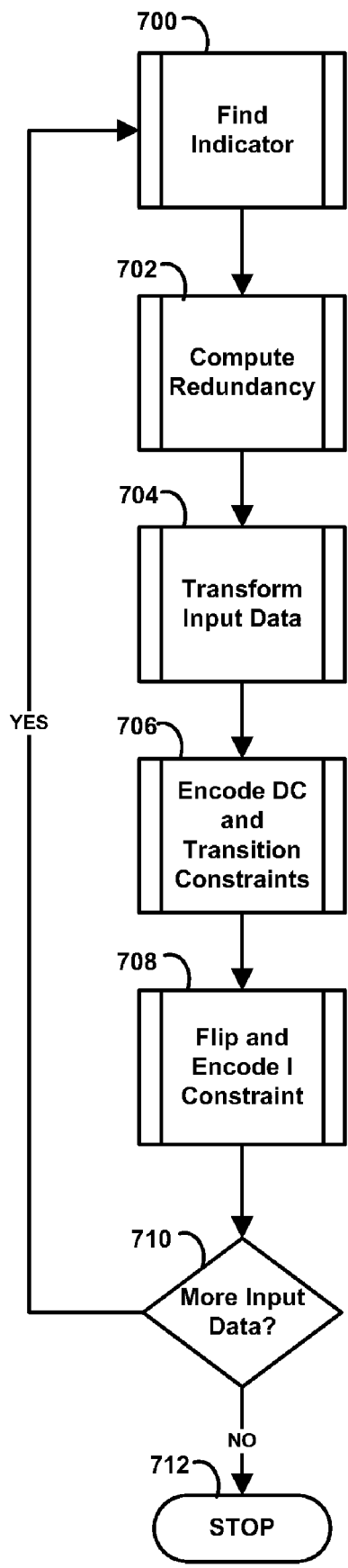
FIG. 7 is a flowchart depicting an illustrative method for encoding channel data using a high-rate DC-limited code in accordance with one embodiment of the invention.

FIG. 7 is a flowchart depicting an illustrative method for creating a high-rate DC-limited code in accordance with one embodiment of the invention. In accordance with the invention, the illustrative method of FIG. 7 may impose a number of constraints on the encoded data, including a bounded long-term average digital sum (i.e., a DC constraint), a maximum run-length (i.e., a k constraint), a maximum interleaved run-length (i.e., an I constraint), a minimum number of transitions in each word, etc. For example, a code be generated with a long-term average digital sum constraint of 0.5, a maximum run-length of 18 (a k constraint of 17), and a maximum interleaved run-length of 19 (an I constraint of 18). The user may select the particular constraints for the code in advance or at encoding time. In addition, the encoder's constraint settings may be dynamically reconfigured while the encoder is in operation to alter the constraints on-the-fly.

At step 700, an indicator v is selected. To select an indicator, the encoder first looks at a prefix of each input word. In some embodiments, the indicator is not a prefix of any forbidden word and is the prefix of at most one input word. Since a limit is put on the maximum number of input words into the encoder, the encoder can always find an indicator v. In some embodiments, step 700 also finds a word z. If the indicator v appeared as the prefix of one input word, the encoder chooses z to be part of the suffix of this input word. Else, the encoder set z to the all-ones pattern.

At step 702, the encoder computes the redundancy y from v and z. As is understood in the art, the encoder may select a simple code to impose some constraint on y, if desired. In step 702, the encoder may also use feedback characteristics from the previous codeword, such as the last codeword's weight, to compute the current redundancy. The redundancy is then appended to the beginning of the encoded sequence before the encoded sequence is output from the encoder. In the example of FIG. 7, the word length q=20; the number of words per encoding cycle n≦113; the prefix length q−r =6; the suffix length r=14; the length of the additional redundancy z is 3; and the length of the total redundancy y is 10. Hence, using the above settings, the maximum code rate of the encoder is 2260/2270. It is to be clearly understood, however, that any desirable settings may be used.

Next the encoder transforms the binary input data into data with an alphabet size m at step 704. The value of m may be selected by the user or automatically selected by the encoder based on such parameters as the input block size, the constraints to be imposed on the data, or any other user or system-derived information. As discussed above, the encoder may transform the data into data with an alphabet size of m using an indicator, a forbidden set, and a data substitution process. Because the value of the alphabet size m need not be a power of 2, a higher-rate code may be created in accordance with the invention.

At step 706, the encoder translates the data so that the resulting code will have at least one desirable property. Namely, at step 706 the encoder encodes the DC and transition constraints. As is understood in the art, several methods exist to impose an DC and transition constraint on a block of data. In some embodiments, the encoder may access commonly used functions stored in memory to assist the encoder in encoding the DC and transition constraints into the transformed data. Each word at the output of step 706 may have a weight of at least 5 and at most 16 and at least 3 transitions. In addition, the first and last ten bits of each word may not be the all-zeros or all-ones patterns.

Next the encoder imposes the interleaved run-length constraint at step 708. The encoder may also flip certain patterns with weights greater than some threshold value. For example, the encoder may flip patterns with weight 16 that follow patterns with weight greater than 10. As is understood in the art, several methods exist to impose an interleaved run-length constraint on a block of data. The encoder may encode the desired run-length constraint and output the constrained data.

Since the encoder operates on blocks of data, at step 710 the encoder decides if there are more blocks to process. The encoder may make this determination in a number of ways. For example, there may be no more data left in the encoder's input buffer to encode. Additionally or alternatively, the user may pass a signal to the encoder to stop encoding the input data. If the encoder determines that there is more input data to process at step 710, control passes back up to step 700. Else, the encoding process is complete. At step 712 the encoder cleans up any resources it may have used and stops the encoding process.

Figure 8:
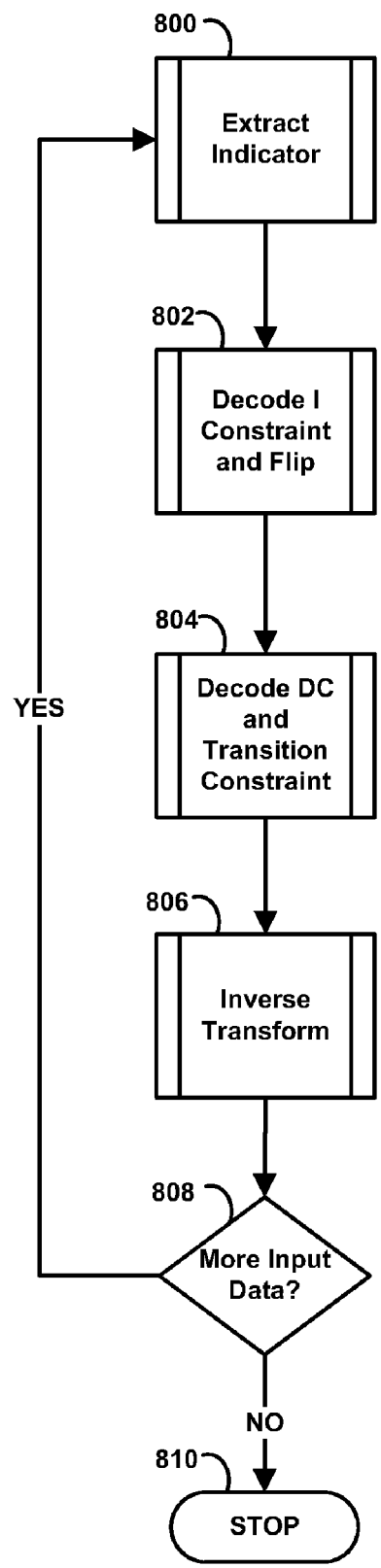
FIG. 8 is a flowchart depicting an illustrative method for decoding channel data encoded using a high-rate DC-limited code in accordance with one embodiment of the invention.

FIG. 8 shows an illustrative decoding process of a high-rate DC-limited code in accordance with one embodiment of the invention. The steps of FIG. 8 complement the steps of FIG. 7 to create a complete high-rate encoding/decoding sequence. The first step in decoding the high-rate code is to extract the indicator v and the word z found in step 700 of FIG. 7 from the redundancy. Since the redundancy was appended to the encoded sequence at encoding step 702 of FIG. 7, step 800 may simply extract the indicator v and the word z from the encoded data.

Next, at step 802, the interleaved run-length constraint is decoded. As is understood in the art, there are various ways to implement this decoding step depending on the encoding process. In addition, at step 802, the decoder may flip all patterns of a certain weight. The value of this weight depends on the value of the weight that was flipped in the corresponding encoding process at step 708 of FIG. 7. For example, if no word of weight 4 was present at the input to step 708, all words of weight 4 must come from weight 16 words and would be flipped in step 802.

At step 804, the DC and transition constraints are decoded. This step is the inverse of step 706 of FIG. 7 in the encoding process. Similarly, the inverses of several commonly-used functions may be made available to the decoder to increase decoder efficiency. Finally, the decoder takes the inverse of the alphabet transform of step 704 of FIG. 7. If the decoder determines that more input data exists to be decoded at step 808, control passes back top step 800. Else, the decoding process is completed at step 808.

Referring now to FIGS. 9A-9F, various exemplary implementations of the present invention are shown.

Figure 9A:
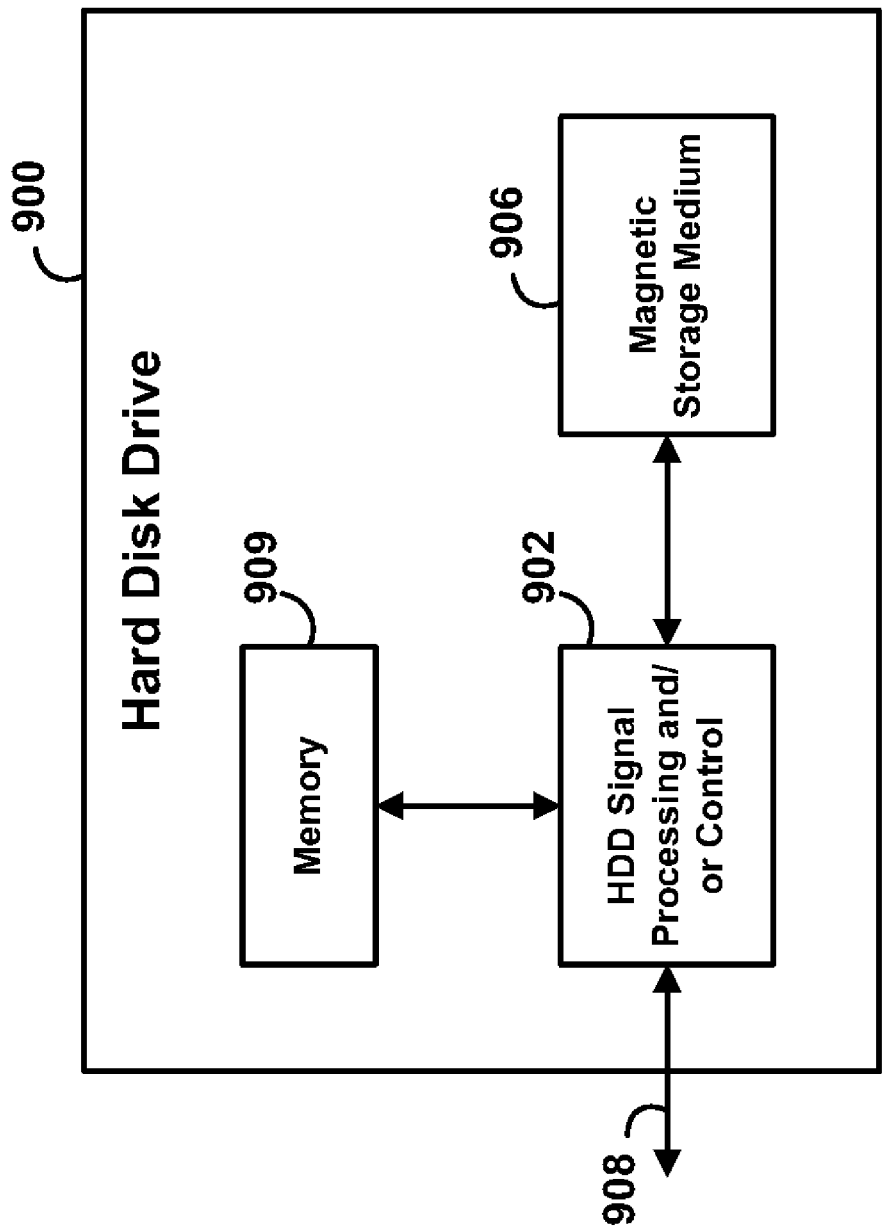
FIG. 9A is a block diagram of an exemplary hard disk drive that can employ the disclosed technology.

Referring now to FIG. 9A, the present invention can be implemented in a hard disk drive 900. The present invention may implement either or both signal processing and/or control circuits, which are generally identified in FIG. 9A at 902. In some implementations, the signal processing and/or control circuit 902 and/or other circuits (not shown) in the HDD 900 may process data, perform coding and/or encryption, perform calculations, and/or format data that is output to and/or received from a magnetic storage medium 906.

The HDD 900 may communicate with a host device (not shown) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Figure 9B:
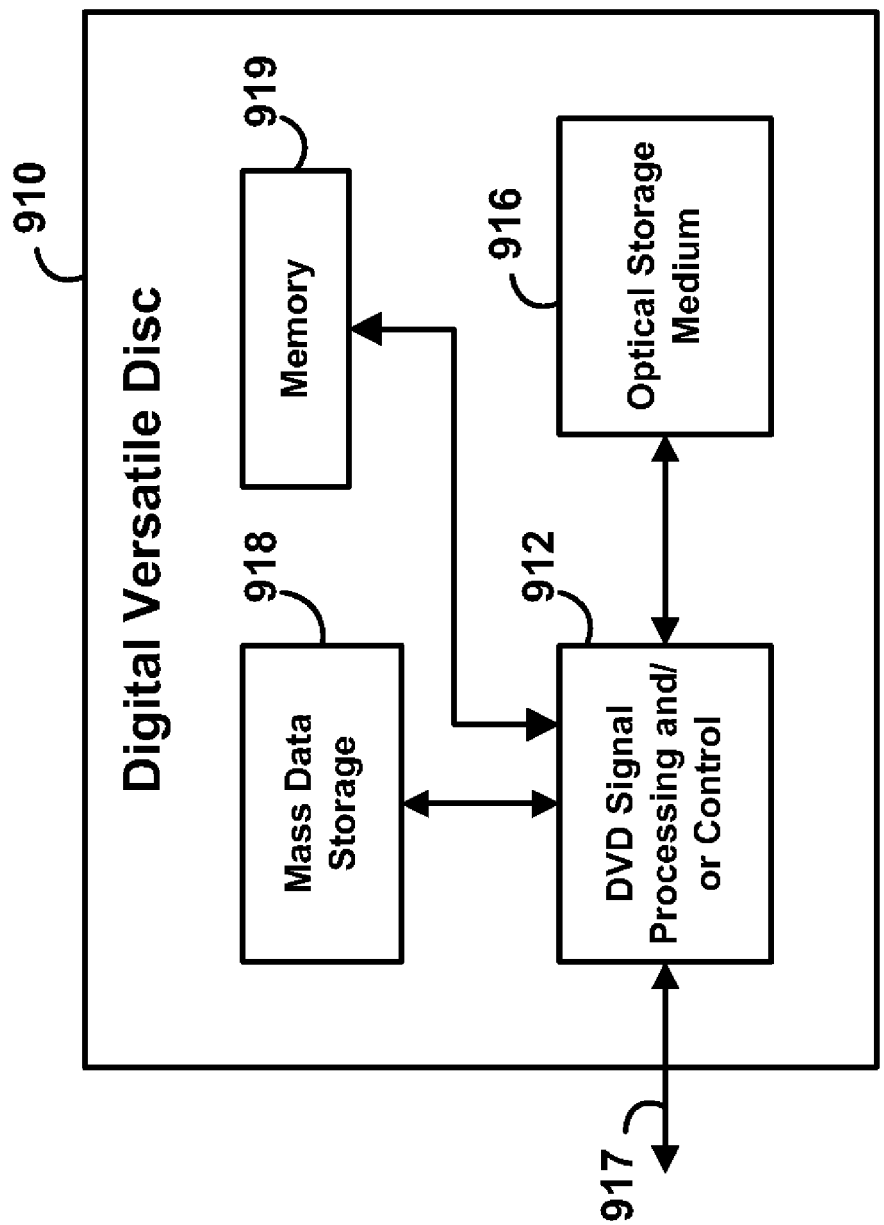
FIG. 9B is a block diagram of an exemplary digital versatile disc that can employ the disclosed technology.

Referring now to FIG. 9B, the present invention can be implemented in a digital versatile disc (DVD) drive 910. The present invention may implement either or both signal processing and/or control circuits, which are generally identified in FIG. 9B at 912, and/or mass data storage of the DVD drive 910. The signal processing and/or control circuit 912 and/or other circuits (not shown) in the DVD 910 may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with mass data storage 918 that stores data in a nonvolatile manner. The mass data storage 918 may include a hard disk drive (HDD). The HDD may have the configuration shown in FIG. 9A. The HDD may be a mini HDD that includes one or more platters having a diameter that is smaller than approximately 1.8". The DVD 910 may be connected to memory 919 such as RAM, ROM, low latency nonvolatile memory such as flash memory and/or other suitable electronic data storage.

Figure 9C:
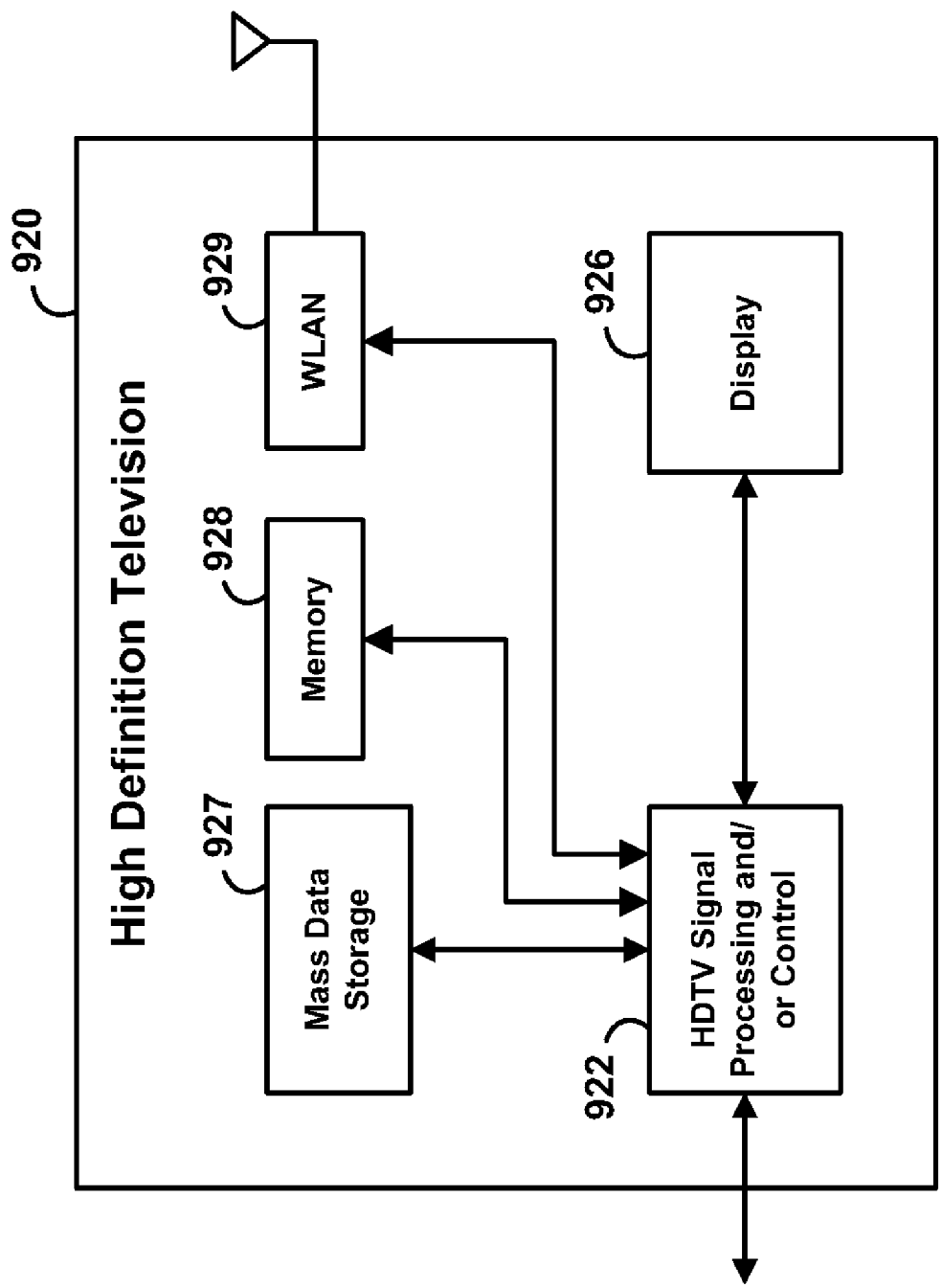
FIG. 9C is a block diagram of an exemplary high definition television that can employ the disclosed technology.

Referring now to FIG. 9C, the present invention can be implemented in a high definition television (HDTV) 920. The present invention may implement either or both signal processing and/or control circuits, which are generally identified in FIG. 9C at 922, a WLAN interface and/or mass data storage of the HDTV 920, The HDTV 920 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical and/or magnetic storage devices. At least one HDD may have the configuration shown in FIG. 9A and/or at least one DVD may have the configuration shown in FIG. 9B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may support connections with a WLAN via a WLAN network interface 929.

Figure 9D:
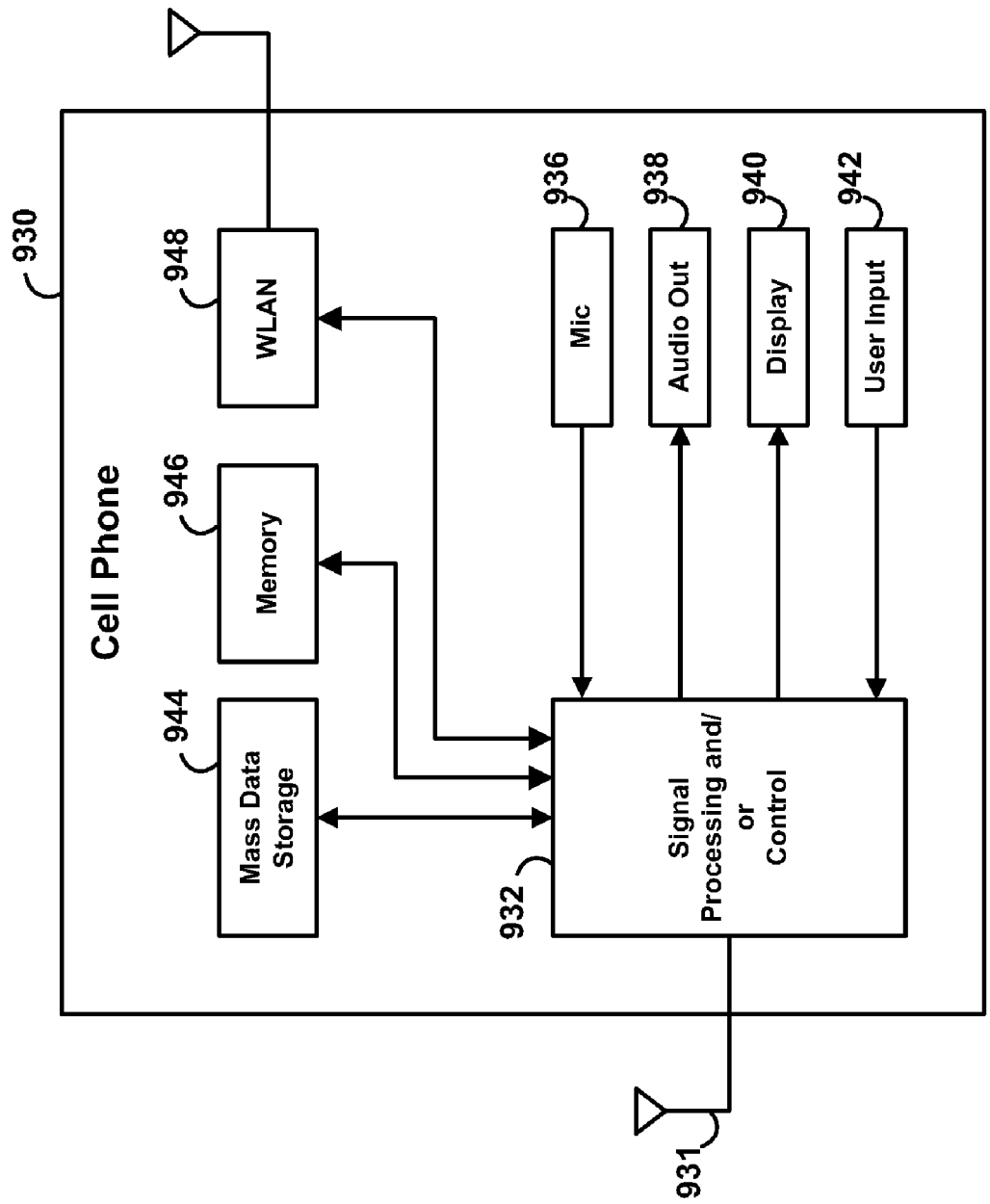
FIG. 9D is a block diagram of an exemplary cell phone that can employ the disclosed technology.

Referring now to FIG. 9D, the present invention can be implemented in a cellular phone 930 that may include a cellular antenna 931. The present invention may implement either or both signal processing and/or control circuits, which are generally identified in FIG. 9D at 932, a WLAN interface and/or mass data storage of the cellular phone 930. In some implementations, the cellular phone 930 includes a microphone 936, an audio output 938 such as a speaker and/or audio output jack, a display 940 and/or an input device 942 such as a keypad, pointing device, voice actuation and/or other input device. The signal processing and/or control circuits 932 and/or other circuits (not shown) in the cellular phone 930 may process data, perform coding and/or encryption, perform calculations, format data and/or perform other cellular phone functions.

The cellular phone 930 may communicate with mass data storage 944 that stores data in a nonvolatile manner such as optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The cellular phone 930 may be connected to memory 946 such as RAM, ROM, low latency nonvolatile memory such as flash memory and/or other suitable electronic data storage. The cellular phone 930 also may support connections with a WLAN via a WLAN network interface 948.

Figure 9E:
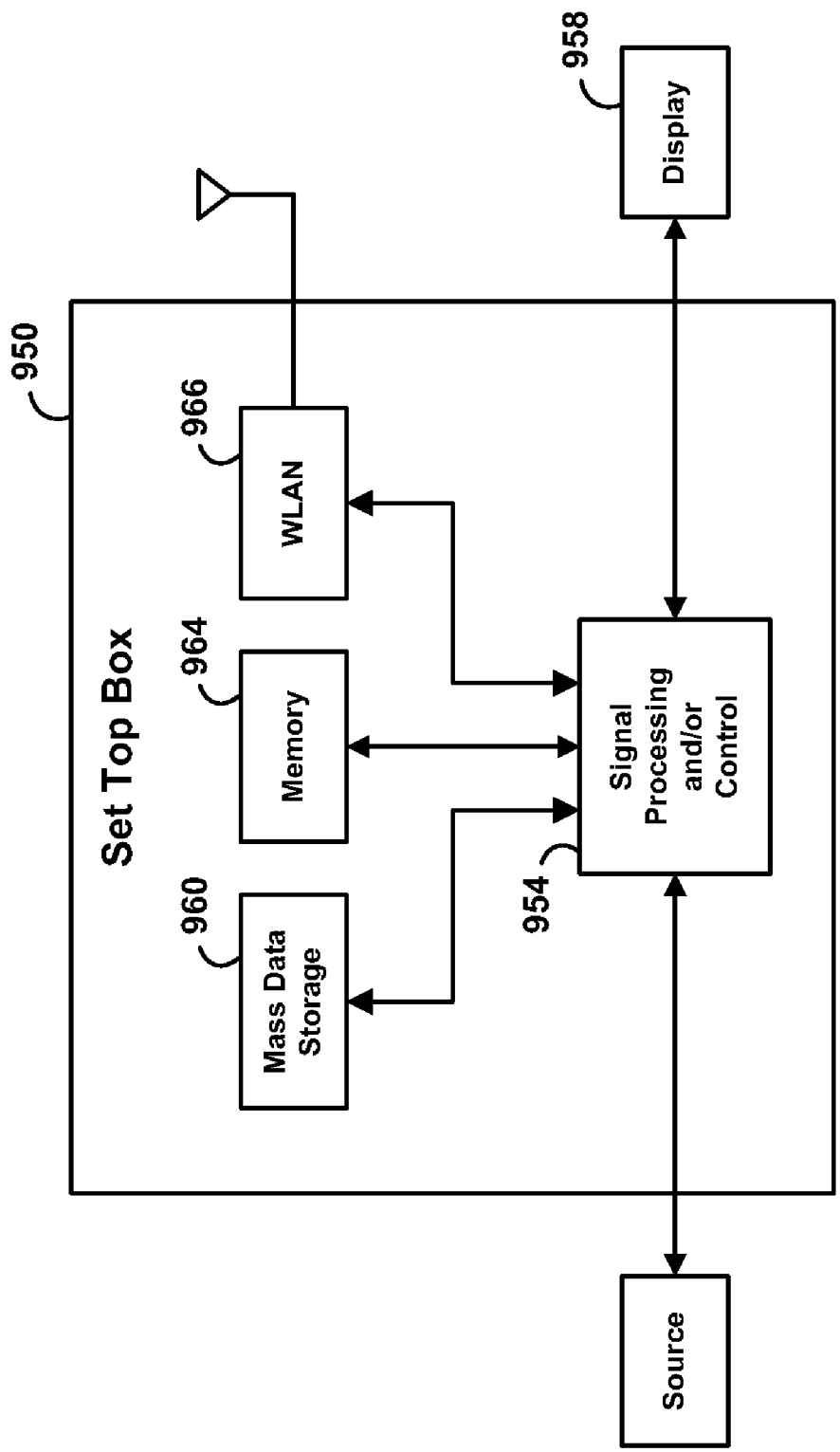
FIG. 9E is a block diagram of an exemplary set top box that can employ the disclosed technology.

Referring now to FIG. 9E, the present invention can be implemented in a set top box 950. The present invention may implement either or both signal processing and/or control circuits, which are generally identified in FIG. 9E at 954, a WLAN interface and/or mass data storage of the set top box 950. The set top box 950 receives signals from a source such as a broadband source and outputs standard and/or high definition audio/video signals suitable for a display 958 such as a television and/or monitor and/or other video and/or audio output devices. The signal processing and/or control circuits 954 and/or other circuits (not shown) of the set top box 950 may process data, perform coding and/or encryption, perform calculations, format data and/or perform any other set top box function.

The set top box 950 may communicate with mass data storage 960 that stores data in a nonvolatile manner. The mass data storage 960 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The set top box 950 may be connected to memory 964 such as RAM, ROM, low latency nonvolatile memory such as flash memory and/or other suitable electronic data storage. The set top box 950 also may support connections with a WLAN via a WLAN network interface 966.

Figure 9F:
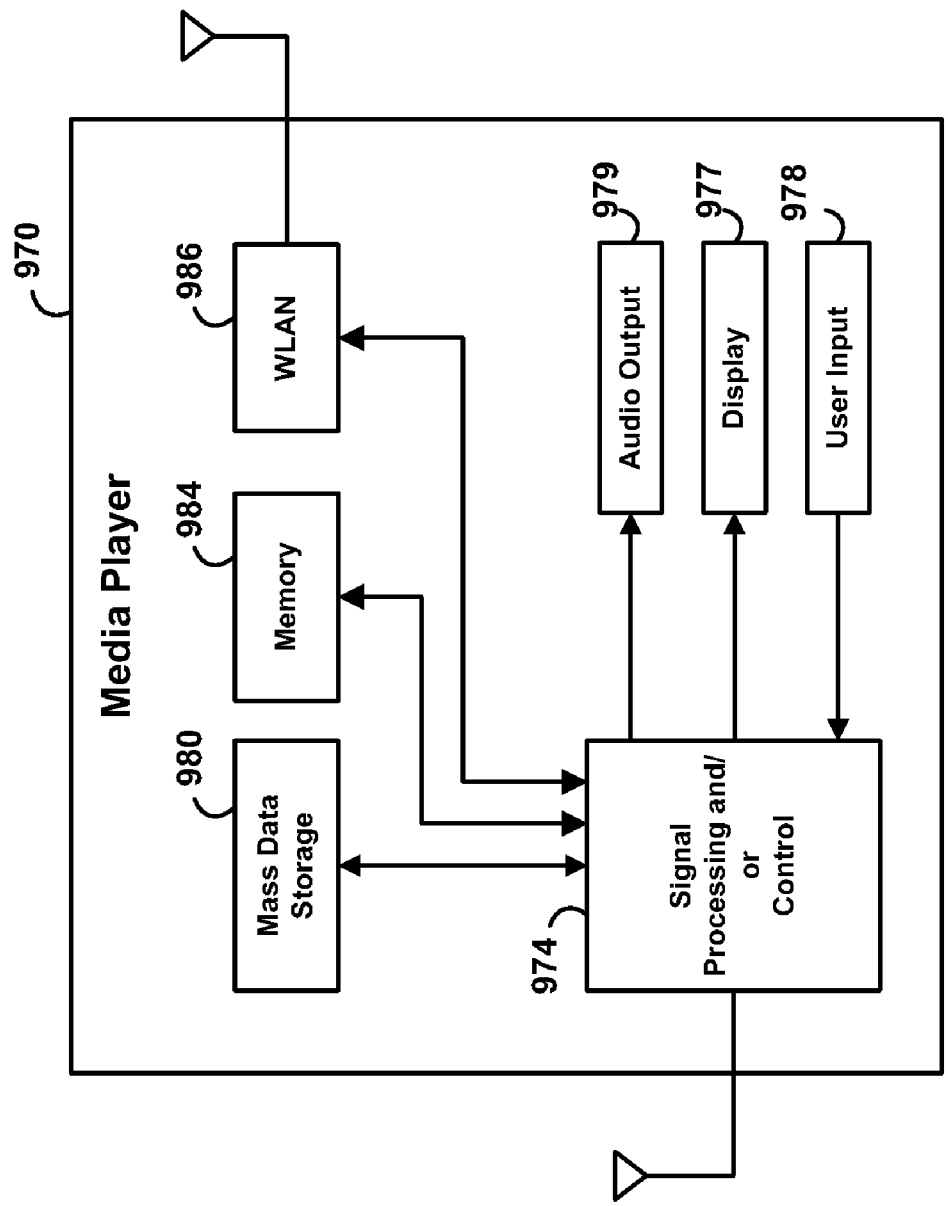
FIG. 9F is a block diagram of an exemplary media player that can employ the disclosed technology.

Referring now to FIG. 9F, the present invention can be implemented in a media player 970. The present invention may implement either or both signal processing and/or control circuits, which are generally identified in FIG. 9F at 974, a WLAN interface and/or mass data storage of the media player 970. In some implementations, the media player 970 includes a display 977 and/or a user input 1108 such as a keypad, touchpad and the like. In some implementations, the media player 970 may employ a graphical user interface (GUI) that typically employs menus, drop down menus, icons and/or a point-and-click interface via the display 977 and/or user input 978. The media player 970 further includes an audio output 979 such as a speaker and/or audio output jack. The signal processing and/or control circuits 974 and/or other circuits (not shown) of the media player 970 may process data, perform coding and/or encryption, perform calculations, format data and/or perform any other media player function.

The media player 970 may communicate with mass data storage 980 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The media player 970 may be connected to memory 974 such as RAM, ROM, low latency nonvolatile memory such as flash memory and/or other suitable electronic data storage. The media player 970 also may support connections with a WLAN via a WLAN network interface 986. Still other implementations in addition to those described above are contemplated.

It will be understood that the foregoing is only illustrative of the principles of the invention, and that various modifications can be made by those skilled in the art without departing from the scope and spirit of the invention. For example, the code constraints described herein are merely illustrative. Other constraints may be applied that may be equally or better suited to particular applications and the following claimed invention.

What is claimed is:

1. A high-rate constrained encoder for encoding a communications signal, the encoder comprising:
   a data transformer configured to convert a binary data sequence into a transformed data sequence of an alphabet size that is selected from any one of a plurality of consecutive integer values; and
   a finite-state encoder of an arbitrary rate constrained code configured to encode the transformed data sequence by imposing at least one constraint on the transformed data sequence and outputting the encoded transformed data sequence.

2. The high-rate constrained encoder of claim 1 wherein the data transformer comprises a substitution block to replace prohibited words in the transformed data sequence.

3. The high-rate constrained encoder of claim 2 wherein the substitution block comprises a mapping table generator that maps each prohibited word to a unique suffix.

4. The high-rate constrained encoder of claim 2 wherein the data transformer further comprises a forbidden set generator to generate words prohibited in the transformed data sequence.

5. The high-rate constrained encoder of claim 1 wherein the data transformer comprises an indicator selector to select at least one indicator that is not a prefix of any forbidden word in the transformed data sequence and that is a prefix of at most a fixed number of words in the binary data sequence.

6. The high-rate constrained encoder of claim 1 wherein the finite-state encoder is selected from the group consisting of a modulation encoder, a look-ahead encoder, and a block-decodable encoder.

7. The high-rate constrained encoder of claim 1 wherein the at least one constraint is selected from the group consisting of a DC constraint, a digital sum constraint, a run-length constraint, an interleaved run-length constraint, and a transition constraint.

8. The high-rate constrained encoder of claim 1 wherein the transformed data sequence is selected from the group consisting of a channel transmission signal, and a perpendicular recording signal.

9. The high-rate constrained encoder of claim 1 further comprising an error-correcting encoder for calculating parity information of the transformed data sequence.

10. A method for encoding a communications signal, the method comprising:
    converting a binary data sequence into a transformed data sequence of an alphabet size that is selected from any one of a plurality of consecutive integer values;
    encoding the transformed data sequence by imposing at least one constraint on the transformed data sequence; and
    outputting the encoded transformed data sequence.

11. The method of claim 10 wherein a selected indicator is appended to the transformed data sequence.

12. The method of claim 10 further comprising replacing words not allowed in the transformed data sequence.

13. The method of claim 12 wherein replacing words not allowed in the transformed data sequence comprises mapping each word not allowed to a unique suffix.

14. The method of claim 12 further comprising generating words not allowed in the transformed data sequence.

15. The method of claim 10 further comprising selecting at least one word that appears as a prefix of at most a fixed number of words in the binary data sequence.

16. The method of claim 10 wherein constraining the transformed data sequence comprises imposing a constraint selected from the group consisting of a DC constraint, a run-length constraint, and a transition constraint.

17. The method of claim 10 further comprising transmitting the transformed data sequence over a channel.

18. The method of claim 10 further comprising recording the transformed data sequence on a non-transitory medium.

19. The method of claim 10 further comprising calculating parity information of the transformed data sequence.

20. The method of claim 10 further comprising interleaving the parity information into the transformed data sequence.

* * * * *